United States Patent
Lin et al.

(10) Patent No.: US 6,569,760 B1
(45) Date of Patent: May 27, 2003

(54) METHOD TO PREVENT POISON VIA

(75) Inventors: Hua-Tai Lin, Yung-Kang (TW); Kung Linliu, HsinChu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 46 days.

(21) Appl. No.: 09/785,113

(22) Filed: Feb. 20, 2001

(51) Int. Cl.[7] .............................................. H01L 21/28

(52) U.S. Cl. ...................... 438/633; 438/638; 438/701; 438/702; 438/780; 438/976

(58) Field of Search ............................. 438/638, 633, 438/701, 702, 780, 976, FOR 355

(56) References Cited

U.S. PATENT DOCUMENTS

| | | | |
|---|---|---|---|
| 5,741,626 A | 4/1998 | Jain et al. ..................... | 430/314 |
| 6,020,255 A | 2/2000 | Tsai et al. ..................... | 438/618 |
| 6,025,259 A | 2/2000 | Yu et al. ........................ | 438/618 |
| 6,043,001 A | 3/2000 | Hirsh et al. ................... | 430/321 |
| 6,077,733 A * | 6/2000 | Chen et al. ................... | 438/182 |
| 6,087,256 A * | 7/2000 | Wada ........................... | 257/280 |
| 6,187,661 B1 * | 2/2001 | Lou ............................. | 438/622 |
| 6,239,821 B1 * | 5/2001 | Silverbrook .................. | 347/20 |
| 6,265,307 B1 * | 7/2001 | Lou ............................. | 438/618 |
| 6,329,290 B1 * | 12/2001 | Zhao ............................. | 438/638 |
| 6,379,869 B1 * | 4/2002 | Schroeder et al. ........... | 430/313 |

OTHER PUBLICATIONS

Uhlig–M et al., "Low k (approximately=32.0) plasma CF polymer films modified by in situ deposited carbon rich adhesion layers", 2000, Advanced Metallization Conference 1999 (AMC 1999), Abstract.*

Uhlig–M et al., "Plasma deposited CF polymer films as ultra low k intermetal dielectric, film properties and application", 2001, First International IEEE Conference on Polymers and Adhesives in Microelectronics and Photonics, Abstract.*

Ghandhi, Sorab, "VLSI Fabrication Principles", 1983 by John Wiley & Sons, Inc., pp. 517–520.*

* cited by examiner

*Primary Examiner*—George Fourson
*Assistant Examiner*—Michelle Estrada
(74) *Attorney, Agent, or Firm*—George O. Saile; Stephen B. Ackerman; Stephen G. Stanton

(57) ABSTRACT

A method for fabricating a via openings, comprising the following steps. A semiconductor structure is provided. A low-k layer is formed upon the semiconductor structure. A via opening is formed within the low-k layer. An inert polymer liner layer is formed upon the low-k layer and within the via opening. A photoresist layer is formed upon the inert polymer liner layer, filling the inert polymer lined via opening. The inert polymer liner layer preventing adverse chemical reactions between the photoresist layer and portions of the low-k layer. The photoresist layer is patterned to expose the inert polymer lined via opening and portions of the inert polymer lined low-k layer adjacent the via opening. The exposed inert polymer lined via opening and portions of the inert polymer lined low-k layer adjacent the via opening and the portions of the inert polymer liner layer upon the via opening and portions of the inert polymer lined low-k layer adjacent the via opening are etched to form a structure opening. The patterned photoresist layer is removed. The structure is cleaned and a planarized metal structure is formed within the structure opening.

22 Claims, 5 Drawing Sheets

POLY( P-T-BUTOXYCARBONYLOXYSTYRENE )

COPOLYMER( P-T-BUTOXYCARBONYLOXYSTYRENE-CO-HYDROXYSTYRENE )

METHOD TO PREVENT POISON VIA

FIELD OF THE INVENTION

The present invention relates generally to fabrication of integrated circuit devices and specifically to methods of forming etched via structures used in the fabricated integrated circuit devices.

BACKGROUND OF THE INVENTION

A common method to etch via/trench structures in low-k intermetal dielectric (IMD) layers or low-k interlevel dielectric (ILD) layers involves forming a patterned photoresist layer over the IMD or IMD layer. A photoresist layer is formed over the structure, the photoresist layer is then selectively exposed and developed to create differing structure portions within the photoresist layer. In a positive photoresist, for example, the exposed, developed portions of the photoresist are then removed to form a patterned photoresist exposing selected portions of the underlying IMD or ILD layers which are then etched.

However the chemical reaction between photoresist and the low-k material occurs and results in footing or scumming at the development step of photolithography.

U.S. Pat. No. 6,025,259 to Yu et al describes a dual damascene process with highly selective boundary layers.

U.S. Pat. No. 6,020,255 to Tsai et al. describes a dual damascene process for borderless interconnects.

U.S. Pat. No. 5,741,626 to Jain et al. describes a dual damascene process with an anti-reflective coating (ARC) layer.

U.S. Pat. No. 6,043,001 to Hirsh et al. describes dual mask pattern transfer techniques in the fabrication of lenslet arrays.

SUMMARY OF THE INVENTION

Accordingly, it is an object of the present invention is to provide a method to etch a low-k material via/trench while avoiding a chemical reaction between the photoresist layer and the low-k material.

Another object of the present invention to prevent footing and scumming during photolithography process of low-k via/trench by preventing the chemical reaction between acid of the photoresist layer and the base of the low-k material.

Other objects will appear hereinafter.

It has now been discovered that the above and other objects of the present invention may be accomplished in the following manner. Specifically, a low-k layer is formed upon the semiconductor structure. A via opening is formed within the low-k layer. An inert polymer liner layer is formed upon the low-k layer and within the via opening. A DUV photoresist layer is formed upon the inert polymer liner layer, filling the inert polymer lined via opening. The inert polymer liner layer preventing adverse chemical reactions between the photoresist layer and portions of the low-k layer. The photoresist layer is patterned to expose the inert polymer lined via opening and portions of the inert polymer lined low-k layer adjacent the via opening. The exposed inert polymer lined via opening and portions of the inert polymer lined low-k layer adjacent the via opening and the portions of the inert polymer liner layer upon the via opening and portions of the inert polymer lined low-k layer adjacent the via opening are etched to form a structure opening. The patterned photoresist layer is removed. The structure is cleaned and a planarized metal structure is formed within the structure opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Known to the Inventors

Figure 1:
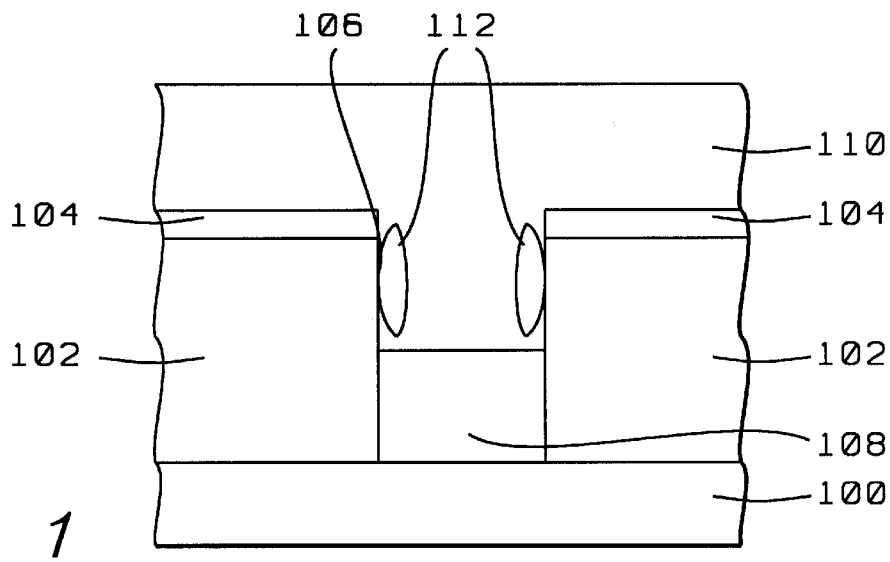
FIG. 1 is a schematic view of a problem known to the inventors during a standard photolithography via etch method.

FIG. 1 illustrates a problem known to the inventors (it is not to be considered as prior art for the purposes the instant invention).

Specifically, FIG. 1 illustrates a poison via 106 of deep ultraviolet (DUV) photoresist (PR) layer 110. IMD or ILD low-k layer 102 is formed upon semiconductor structure 100. Anti-reflective coating (ARC) layer 104 may be formed upon IMD/ILD layer 102. A first patterned PR layer (not shown) is formed over ARC layer 104, exposed and developed to expose an area of ARC layer 104. ARC layer 104/IMD/ILD layer 102 are etched to form via 106. IMD/ILD layer 102 may be partially etched, as shown in FIG. 1, leaving underlying portion 108 of IMD/ILD layer 102.

To further pattern etched IMD/ILD layer 102 as second PR layer 110 is formed over the structure, filling via 106. Second PR layer 110 is a photo acid generator (PAG) and produces acid (H+) during further processing to form a patterned second PR layer 110. A chemical reaction occurs at 112 between the base of the low-k material of low-k IMD/ILD layer 102 and the $H^+$ generated by the PAG in second PR layer 110 and poisons via 106.

Preferred Embodiment of the Present Invention

Unless otherwise specified, all structures, layers, steps, methods, etc. may be formed or accomplished by conventional steps or methods known in the prior art.

Initial Structure

Figure 2:
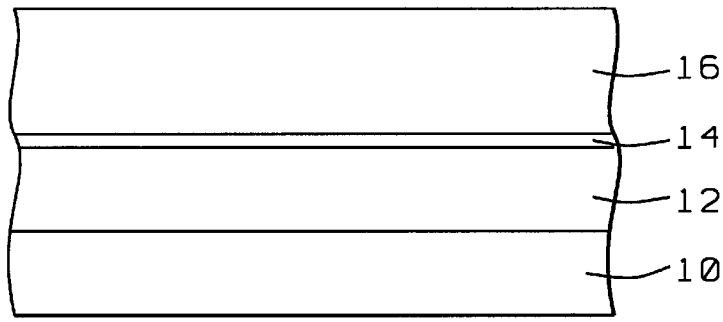
FIGS. 2 to 10 illustrate the preferred embodiment of the present invention.

Accordingly, as shown in FIG. 2 lower IMD/ILD low-k dielectric layer (lower low-k layer) 12 is formed over semiconductor structure 10. Lower low-k layer 12 may be comprised of FSG, HBD or SiLK, and is preferably HBD. Lower low-k layer 12 is preferably from about 2000 to 6000Å thick, and is more preferably from about 3000 to 5000Å thick.

Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

In the example, given below, a dual damascene structure is formed although the present invention is admirably suited to the formation of a single damascene structure, via interconnect structure, or trench line structure, etc.

An optional etch stop layer 14 is formed over lower low-k layer 12. Etch stop layer 14 may be comprised of SiN or SiC, and is preferably SiN. Etch stop layer 14 is preferably from about 200 to 900Å thick, and is more preferably from about 300 to 800Å thick.

Upper IMD/ILD low-k dielectric layer (upper low-k layer) 16 is formed over etch stop layer 14 to a thickness of preferably from about 2000 to 6000Å, and more preferably from about 3000 to 5000Å thick. Upper low-k 16 may be comprised of FSG, Black Diamond™(BD) or SiLK, and is preferably HBD.

If optional etch stop layer 14 is not used, lower and upper low-k layers are formed as a unitary IMD/ILD low-k dielectric layer have a thickness of preferably from about 4000 to 12,000Å, and more preferably from about 6000 to 10,000Å.

Via Opening 20 Etch/Clean

Figure 3:
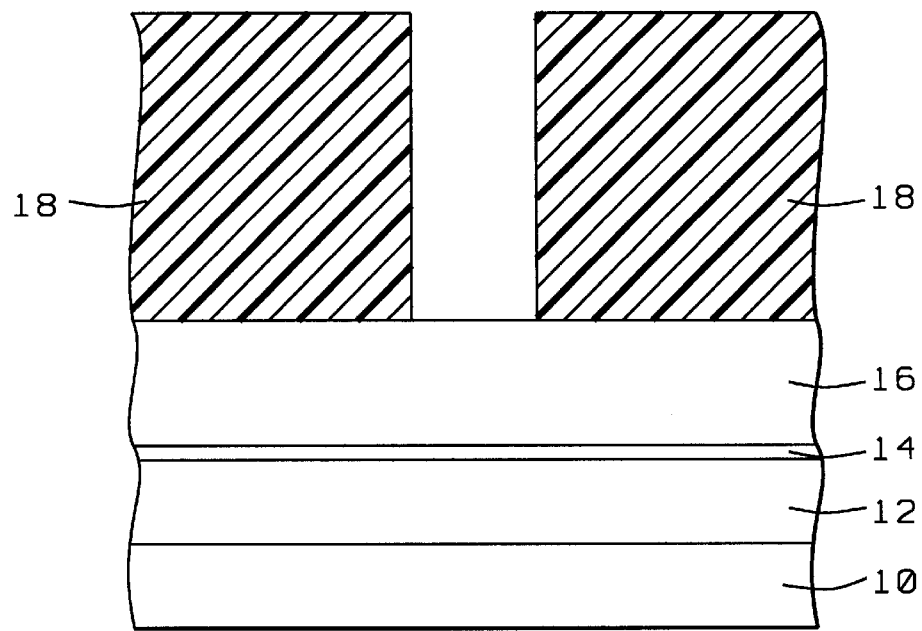
Figure 11:
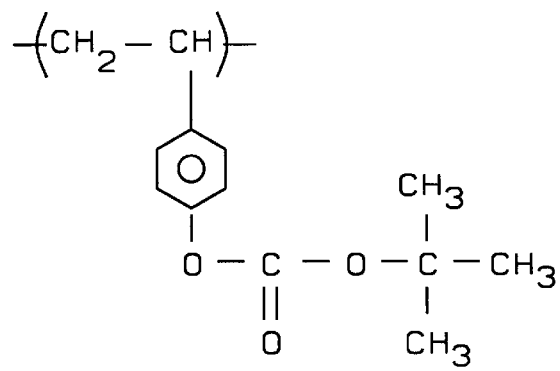
FIG. 11 illustrates the chemical structure of poly (p-t-butoxycarbonyloxystyrene).
Figure 12:
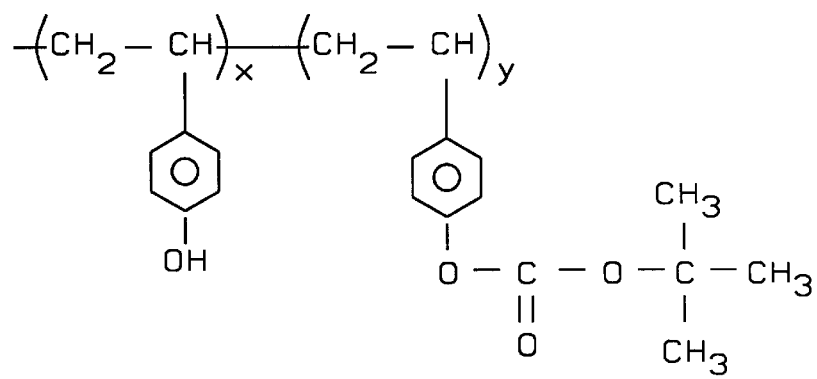
FIG. 12 illustrates the chemical structure of copolymer (p-t-butoxycarbonyloxystyrene-co-hydroxystyrene).

As shown in FIG. 3, first deep ultraviolet (DUV) photoresist (PR) layer is formed over upper low-k layer 16 (or unitary low-k layer), exposed and developed to form patterned first PR layer 18. Patterned PR layer 18 is formed of polymethylmethacrylate (PMMA), poly (p-t-butoxycarbonyloxystyrene) (As shown in FIG. 11) or copolymer (p-t-butoxycarbonyloxystyrene-co-hydroxystyrene) (As shown in FIG. 12), and is preferably formed of poly (p-t-butoxycarbonyloxystyrene). First PR layer 18 is preferably from about 300 to 1000 nm thick, and more preferably from about 400 to 900 nm thick.

Figure 4:
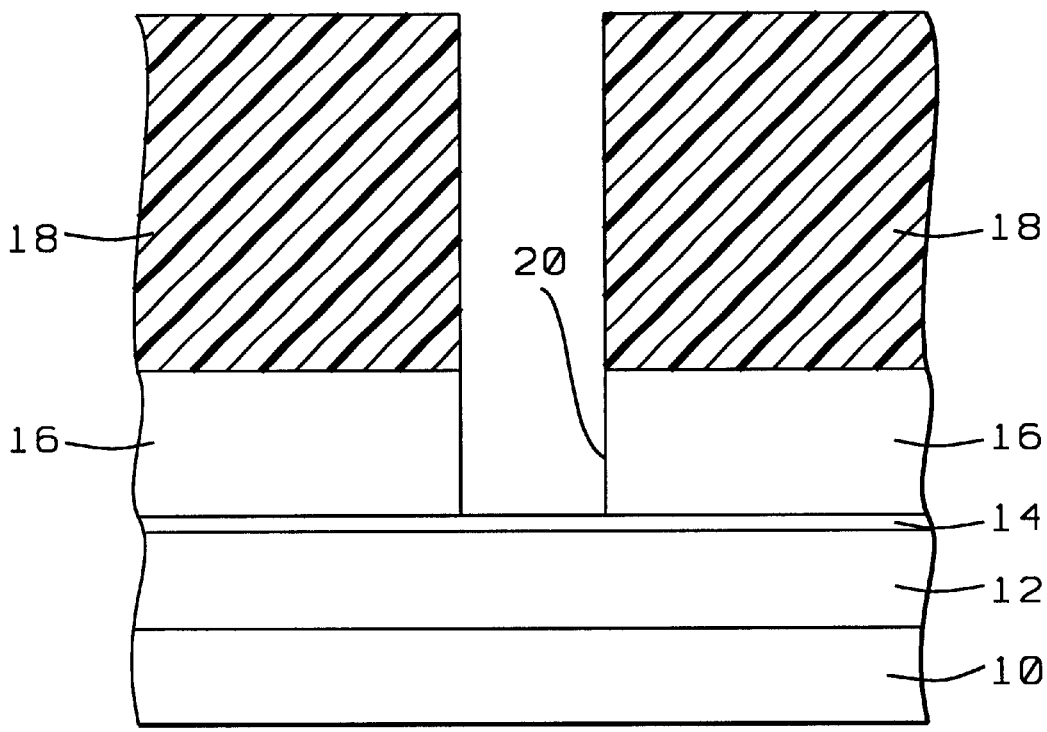

As shown in FIG. 4, upper low-k layer 16 is then etched, using patterned first PR layer 18 as a mask, to form via opening 20. If optional etch stop layer 14 is utilized, upper low-k layer 16 is etched down to etch stop layer 14. In any event, via opening 20 is preferably from about 2000 to 6000Å deep and from about 1800 to 3500Å wide, and more preferably from about 3000 to 5000Å deep and from about 1800 to 2500Å wide.

Figure 5:
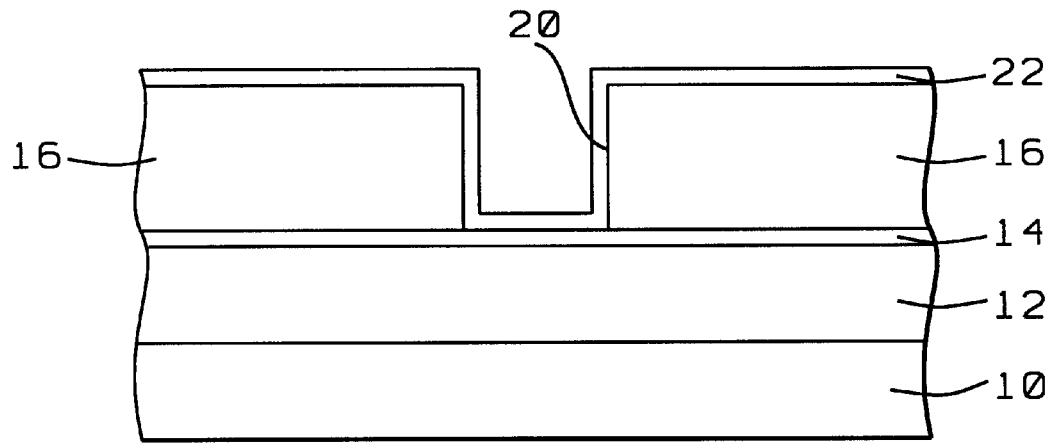

As shown if FIG. 5, patterned first PR layer 18 is stripped and removed.

The structure is then cleaned.

Formation of Inert Polymer Layer Within Via Opening 20

As further shown in FIG. 5, in a key step of the invention, an inert polymer layer 22 is formed, preferably by chemical vapor deposition (CVD), over the structure, lining via opening 20. Inert polymer layer 22 may be composed of PTFE (Teflon®) or a PTFE-like polymer, and is preferably a $(CF_2)_n$ polymer (as will be used hereafter as an example). Inert polymer layer 22 is preferably from about 2 to 60 nm thick, and more preferably from about 5 to 50 nm thick.

For example, inert $(CF_2)_n$ polymer layer 22 may be formed under the following conditions:
pressure: from about 5 to 200 mTorr;
RF power: from about 50 to 500 W;
$CH_2F_2$: from about 10 to 300 sccm; and
Ar carrier gas: from about 5 to 200 sccm.

The formation of $(CF_2)_n$ polymer layer 22 can be controlled to be preferably from about 2 nm to 60 nm thick, and more preferably from about 5 to 50 nm thick. $(CF_2)_n$ polymer layer 22 is Teflon®-like and the inventors have found it to be admirably suited to prevent chemical reaction between acid (PAG of photoresist) and base (e.g. upper low-k layer 16) (see below). PAG is comprised of: onium salts including diphenyliodonium salts and triphenylsulfonium salts; halogen compounds; and o-nitrobenityl esters such as 2-nitrobenzylsulfonic acid ester.

Formation of Patterned Second PR Layer 26'

To complete formation of a dual damascene structure the structure is etched once again as follows, for example.

Figure 6:
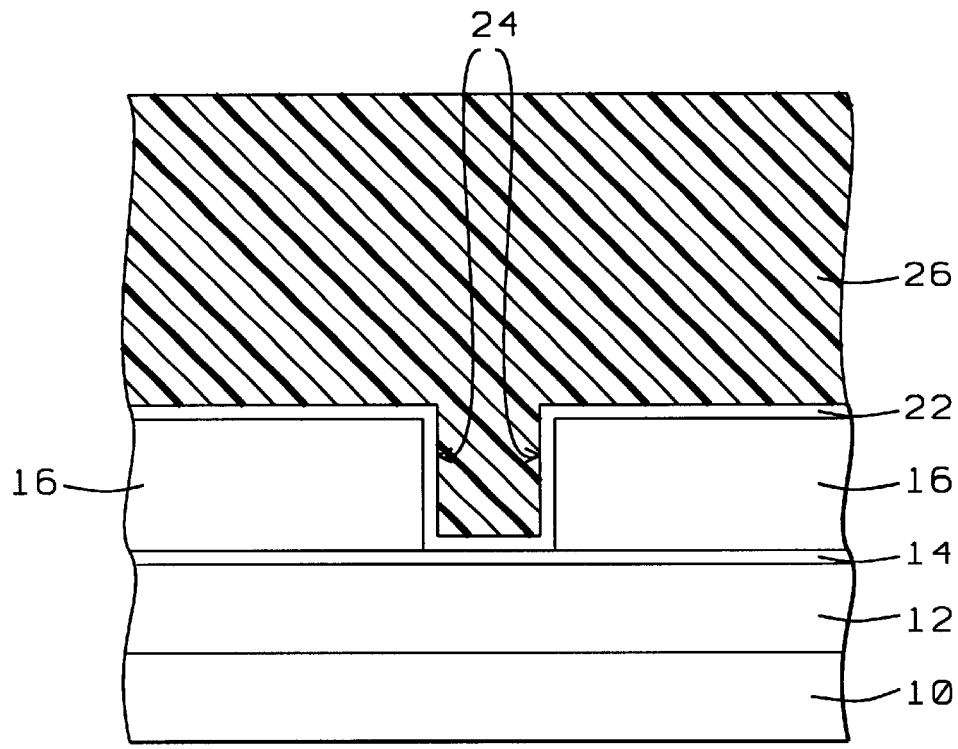

As shown in FIG. 6, second PR layer 26, that may be DUV PR, is formed over the $(CF_2)_n$ polymer 22 lined etched structure, filling $(CF_2)_n$ polymer 22 lined via opening 20. $(CF_2)_n$ polymer layer 22 prevents the PR layer 26 PAG acid/upper low-k layer 16 base reaction 24. This eliminates footing and scumming.

Second PR layer 26 is formed of polymethylmethacrylate (PMMA), poly (p-t-butoxycarbonyloxystyrene) (As shown in FIG. 11) or copolymer (p-t-butoxycarbonyloxystyrene-co-hydroxystyrene) (As shown in FIG. 12), and is preferably formed of poly (p-t-butoxycarbonyloxystyrene).

Second PR layer 26 is preferably from about 300 to 1000 nm thick, and more preferably from about 400 to 900 nm thick.

Figure 7:
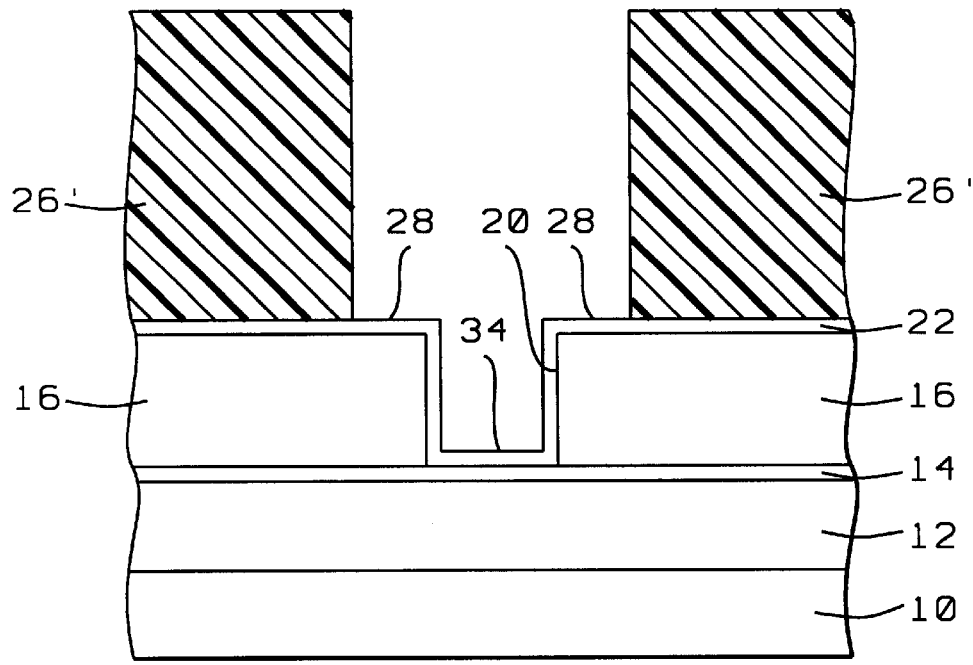

As shown in FIG. 7, second PR layer 26 is exposed and developed to form patterned second PR layer 26', exposing a portion of $(CF_2)_n$ polymer layer 22 lined non-etched upper low-k layer 16 adjacent either side of lined via opening 20 at 28, and exposing lined via opening 20.

Formation of etched Dual Damascene Opening 32

Figure 8:
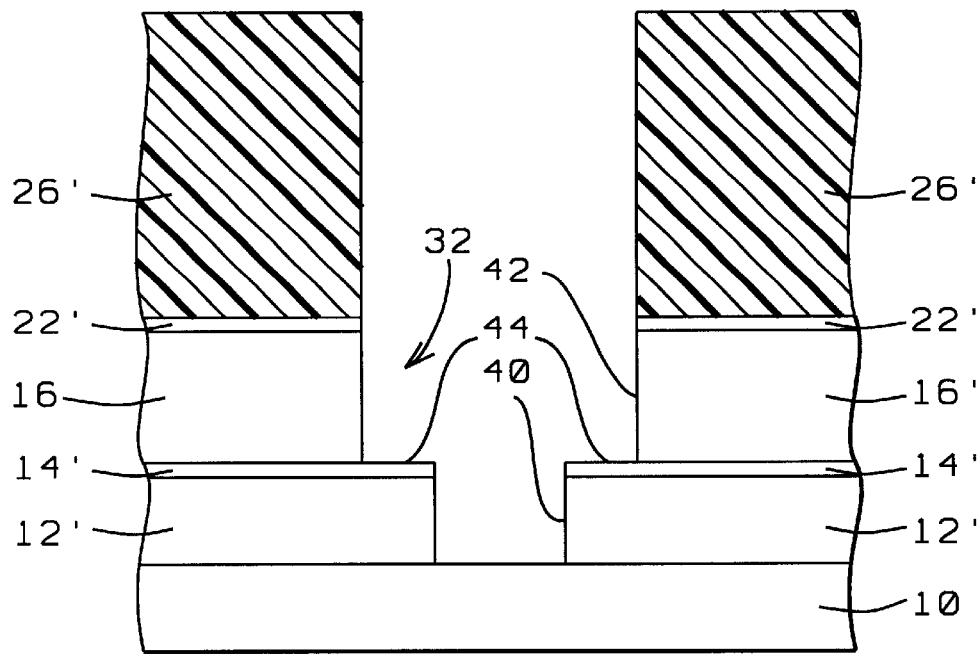

As shown in FIG. 8, the exposed portion of $(CF_2)_n$ polymer layer 22 lined non-etched upper low-k layer 16 adjacent either side of lined via opening 20 at 28, and the horizontal bottom of exposed lined via opening 20 at 34 are etched to form dual damascene opening 32. It is noted that both the exposed horizontal and vertical portions of $(CF_2)_n$ polymer layer 22 is also simultaneously etched with the formation of etched dual damascene opening 32.

Dual damascene opening is comprised of lower damascene via opening 40 and upper damascene trench opening 42.

Lower damascene via opening 40 may expose a device or line (not shown) on the upper surface of semiconductor structure 10. Upper damascene trench opening 42 stops on optional etch stop layer 14' at 44.

Removal of Patterned Second PR Layer 26'

Figure 9:
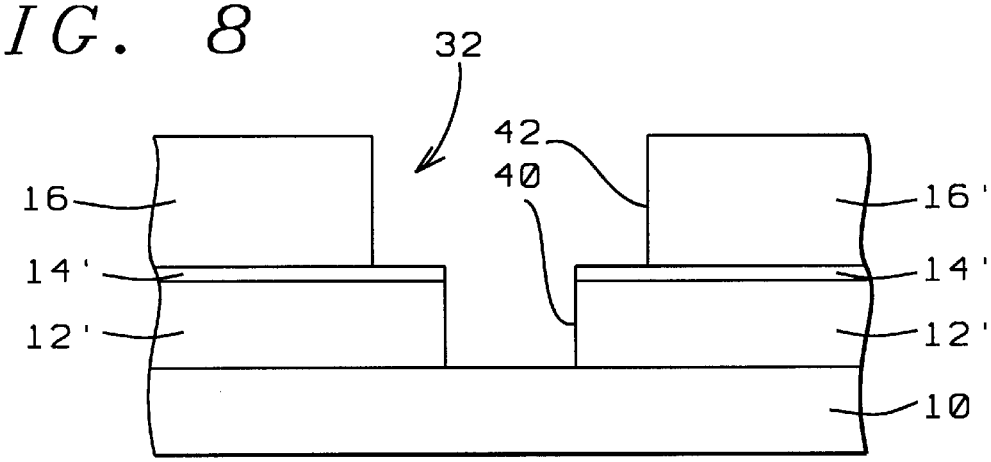

As shown in FIG. 9, patterned second PR layer 26' is stripped and removed.

The structure is then cleaned, which also removes any remnants of $(CF_2)_n$ polymer layer 22 etched during the formation of dual damascene opening 32.

Formation of Dual Damascene Structure 46

Figure 10:
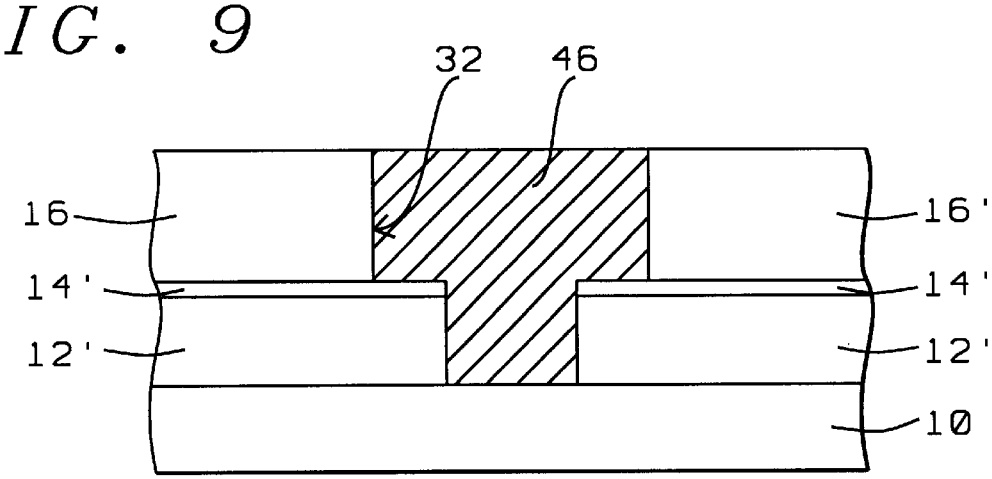

As shown in FIG. 10, a metal layer is formed over the etched structure of FIG. 9, and is planarized to remove the excess metal to form a planarized dual damascene metal structure 46 within dual damascene opening 32.

The method of the present invention may be used for either a partial via etch or a full via etch and, as noted above, the present invention is also admirably suited to the formation of a single damascene structure, via interconnect structure, or trench line structure, etc.

Advantages of the Present Invention

The advantages of the present invention include the elimination of footing or scumming at the development step of photolithography.

While particular embodiments of the present invention have been illustrated and described, it is not intended to limit the invention, except as defined by the following claims.

We claim:

1. A method for fabricating a via openings, comprising the steps of:

providing a semiconductor structure;

forming a low-k layer upon the semiconductor structure;

forming a via opening within the low-k layer;

forming an inert polymer liner layer upon the low-k layer and within the via opening; wherein the inert polymer liner layer is a $(CF_2)_n$ polymer formed under the conditions including: a pressure from about 5 to 200 mTorr; power from about 50 to 500 W; and from about 10 to 300 sccm $CH_2F_2$ in from about 5 to 200 sccm Ar carrier gas;

forming, by photolithography and etching, a structure opening within the low-k layer; and forming a planarized metal structure within the structure opening.

2. The method of claim 1, wherein the low-k layer is comprised of a material selected from the group consisting of FSG, Black Diamond and SiLK; the inert polymer liner layer is comprised of a material selected from the group consisting of PTFE, a $(CF_2)_n$ polymer and a PTFE polymer; and the photoresist layer is comprised of a material selected from the group consisting of PMMA, poly (p-t-butoxycarbonyloxystyrene) and copolymer (p-t-butoxycarbonyloxystyrene-co-hydroxystyrene).

3. The method of claim 1, wherein the low-k layer is from about 2000 to 6000Å thick; and the inert polymer liner layer is from about 2 to 60 nm thick.

4. The method of claim 1, wherein the low-k layer is from about 3000 to 5000Å thick; and the inert polymer liner layer is from about 5 to 50 nm thick.

5. The method of claim 1, wherein the via opening is from about 2000 to 6000Å deep, and from about 1800 to 3500Å wide.

6. The method of claim 1, wherein the via opening is from about 3000 to 5000Å deep, and from about 1800 to 2500Å wide.

7. The method of claim 1, including an etch stop layer within the low-k layer and wherein the bottom of the via opening exposes the etch stop layer.

8. The method of claim 1, including an etch stop layer within the low-k layer and wherein the bottom of the via opening exposes a first portion of the etch stop layer, and a portion of the structure opening exposes a second portion of the etch stop layer.

9. The method of claim 1, wherein the structure opening is formed by:

forming a photoresist layer upon the inert polymer liner layer, filling the inert polymer lined via opening; the inert polymer liner layer preventing adverse chemical reactions between the photoresist layer and portions of the low-k layer;

patterning the photoresist layer to expose the inert polymer lined via opening and portions of the inert polymer lined low-k layer adjacent the via opening;

etching the exposed inert polymer lined via opening and portions of the inert polymer lined low-k layer adjacent the via opening and the portions of the inert polymer liner layer upon the via opening and portions of the inert polymer lined low-k layer adjacent the via opening to form a structure opening;

removing the patterned photoresist layer; and cleaning the structure.

10. A method for fabricating a via openings, comprising the steps of:

providing a semiconductor structure;

forming a lower low-k layer upon the semiconductor structure;

forming an etch stop layer upon the lower low-k layer;

forming an upper low-k layer upon the etch stop layer;

etching the upper low-k layer, exposing the etch stop layer and forming a via opening within the upper low-k layer;

forming an inert polymer liner layer upon the upper low-k layer and within the via opening and over the exposed etch stop layer; wherein the inert polymer liner layer is a $(CF_2)_n$ polymer formed under the conditions including: a pressure from about 5 to 200 mTorr; power from about 50 to 500 W; and from about 10 to 300 sccm $CH_2F_2$ in from about 5 to 200 sccm Ar carrier gas;

forming a photoresist layer upon the inert polymer liner layer, filling the inert polymer lined via opening; the inert polymer liner layer preventing adverse chemical reactions between the photoresist layer and portions of the low-k layer;

exposing and developing the photoresist layer to form a patterned photoresist layer, the patterned photoresist layer exposing the inert polymer lined via opening and portions of the inert polymer lined low-k layer adjacent the via opening;

etching the exposed inert polymer lined via opening and portions of the inert polymer lined low-k layer adjacent the via opening and the portions of the inert polymer liner layer upon the via opening and portions of the inert polymer lined low-k layer adjacent the via opening to form a dual damascene opening;

removing the patterned photoresist layer;

cleaning the structure; and forming a planarized metal dual damascene structure within the dual damascene opening.

11. The method of claim 10, wherein the lower low-k layer is comprised of a material selected from the group consisting of FSG, Black Diamond and SiLK; the etch stop layer is comprised of a material selected from the group consisting of SiN and SiC; the upper low-k layer is comprised of a material selected from the group consisting of FSG, Black Diamond and SiLK; the inert polymer liner layer is comprised of a material selected from the group consisting of PTFE, a $(CF_2)_n$ polymer, and a PTFE polymer; and the photoresist layer is comprised of a material selected from the group consisting of PMMA, poly (p-t-butoxycarbonyloxystyrene) and copolymer (p-t-butoxycarbonyloxystyrene-co-hydroxystyrene).

12. The method of claim 10, wherein the lower low-k layer is from about 2000 to 6000Å thick; the etch stop layer is from about 200 to 900Å thick; the upper low-k layer is from about 2000 to 6000Å thick; and the inert polymer liner layer is from about 2 to 60 nm thick.

13. The method of claim 10, wherein the lower low-k layer is from about 3000 to 5000Å thick; the etch stop layer is from about 300 to 800Å thick; the upper low-k layer is from about 3000 to 5000Å thick; and the inert polymer liner layer is from about 5 to 50 nm thick.

14. The method of claim 10, wherein the via opening is from about 2000 to 6000Å deep, and from about 1800 to 3500Å wide.

15. The method of claim 10, wherein the via opening is from about 3000 to 5000Å deep, and from about 1800 to 2500Å wide.

16. A method for fabricating a via openings, comprising the steps of:

providing a semiconductor structure;

forming a lower low-k layer upon the semiconductor structure;

forming an etch stop layer upon the lower low-k layer;

forming an upper low-k layer upon the etch stop layer;

forming a first photoresist layer upon the upper low-k layer;

exposing and developing first photoresist layer to form a patterned first photoresist layer exposing the upper low-k layer;

etching the upper low-k layer using the patterned first photoresist layer as a mask, exposing the etch stop layer and forming a via opening within the upper low-k layer;

removing the patterned first photoresist layer;

cleaning the structure a first time;

forming an inert $(CF_2)_n$ polymer liner layer upon the upper low-k layer and within the via opening and over the exposed etch stop layer;

forming a second photoresist layer upon the inert polymer liner layer, filling the inert polymer lined via opening; the inert polymer liner layer preventing adverse chemical reactions between the second photoresist layer and portions of the low-k layer;

exposing and developing the second photoresist layer to form a patterned second photoresist layer, the patterned second photoresist layer exposing the inert polymer lined via opening and portions of the inert polymer lined low-k layer adjacent the via opening;

etching the exposed inert polymer lined via opening and portions of the inert polymer lined low-k layer adjacent the via opening and the portions of the inert polymer liner layer upon the via opening and portions of the inert polymer lined low-k layer adjacent the via opening using the patterned second photoresist layer as a mask to form a dual damascene opening;

removing the patterned second photoresist layer;

cleaning the structure a second time; and forming a planarized metal dual damascene structure within the dual damascene opening.

17. The method of claim 16, wherein the lower low-k layer is comprised of a material selected from the group consisting of FSG, Black Diamond and SiLK; the etch stop layer is comprised of a material selected from the group consisting of SiN and SiC; the upper low-k layer is comprised of a material selected from the group consisting of FSG, Black Diamond and SiLK; and the second photoresist layer is comprised of a material selected from the group consisting of PMMA, poly (p-t-butoxycarbonyloxystyrene) and copolymer (p-t-butoxycarbonyloxystyrene-co-hydroxystyrene).

18. The method of claim 16, wherein the lower low-k layer is from about 2000 to 6000Å thick; the etch stop layer is from about 200 to 900Å thick; the upper low-k layer is from about 2000 to 6000Å thick; and the inert $(CF_2)_n$ polymer liner layer is from about 2 to 60 nm thick.

19. The method of claim 16, wherein the lower low-k layer is from about 3000 to 5000Å thick; the etch stop layer is from about 300 to 800Å thick; the upper low-k layer is from about 3000 to 5000Å thick; and the inert $(CF_2)_n$ polymer liner layer is from about 5 to 50 nm thick.

20. The method of claim 16, wherein the via opening is from about 2000 to 6000Å deep, and from about 1800 to 3500Å wide.

21. The method of claim 16, wherein the via opening is from about 3000 to 5000Å deep, and from about 1800 to 2500Å wide.

22. The method of claim 16, wherein the inert $(CF_2)_n$ polymer liner layer is formed under the conditions including: a pressure from about 5 to 200 mTorr; power from about 50 to 500 W; and from about 10 to 300 sccm $CH_2F_2$ in from about 5 to 200 sccm Ar carrier gas.

* * * * *